US006765513B2

(12) United States Patent
Sundareson

(10) Patent No.: US 6,765,513 B2
(45) Date of Patent: Jul. 20, 2004

(54) DECODING BIT STREAMS COMPRESSED WITH COMPRESSION TECHNIQUES EMPLOYING VARIABLE LENGTH CODES

(75) Inventor: Prabindh Sundareson, Madurai (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/314,342

(22) Filed: Dec. 9, 2002

(65) Prior Publication Data

US 2004/0108946 A1 Jun. 10, 2004

(51) Int. Cl.[7] .............................................. H03M 7/40
(52) U.S. Cl. ...................................................... 341/67
(58) Field of Search ...................................... 341/65, 67

(56) References Cited

U.S. PATENT DOCUMENTS

| | | | | | |
|---|---|---|---|---|---|
| 5,226,082 A | * | 7/1993 | Kustka | ........................ | 380/46 |
| 5,245,338 A | * | 9/1993 | Sun | ............................. | 341/67 |
| 5,831,557 A | * | 11/1998 | Handley | ....................... | 341/67 |
| 6,043,765 A | * | 3/2000 | Twardowski | .................. | 341/65 |
| 6,580,377 B1 | * | 6/2003 | Du et al. | ....................... | 341/67 |

* cited by examiner

Primary Examiner—Howard L. Williams
(74) Attorney, Agent, or Firm—Robert D. Marshall, Jr.; W. James Brady, III; Frederick J. Telecky, Jr.

(57) ABSTRACT

A maximum length (M) of compressed codes desired to be decoded in a single lookup is determined. $2^M$ rows are generated, with each row having a bit indicating whether a corresponding M-bit combination, when viewed from the first bit, contains a compression code and a source code corresponding to the compression code. A matching row corresponding to a value represented by M-bits of a source bit stream ("present portion") is first determined, and the source code in the matching row is set as the decoded value if the matching row is indicated to contain a compression code. If the length (P) of the compression code corresponding to the decoded value is less than M, the last (M−P) bits of the present portion are used as a part of the next portion. Additional bits are used to generate the decoded value if the present portion does not contain the entire compression code.

16 Claims, 2 Drawing Sheets

| | X | Y | COMPRESSED CODE |
|---|---|---|---|
| 301 | 0 | 0 | 1 |
| 302 | 0 | 1 | 010 |
| 303 | 0 | 2 | 000001 |
| 304 | 1 | 0 | 011 |
| 305 | 1 | 1 | 001 |
| 306 | 1 | 2 | 00001 |
| 307 | 2 | 0 | 00011 |
| 308 | 2 | 1 | 00010 |
| 309 | 2 | 2 | 000000 |

| | COMBINATION | MEMORY VALUE |
|---|---|---|
| 401 | 000 | 1000 0000 0000 1000 |
| 402 | 001 | 0011 0000 0001 0001 |
| 403 | 010 | 0011 0000 0000 0001 |
| 404 | 011 | 0011 0000 0001 0000 |
| 405 | 100 | 0001 0000 0000 0000 |
| 406 | 101 | 0001 0000 0000 0000 |
| 407 | 110 | 0001 0000 0000 0000 |
| 408 | 111 | 0001 0000 0000 0000 |
| 409 | 000 00 | 1000 0000 0000 0100 |
| 410 | 000 01 | 0010 0000 0001 0010 |
| 411 | 000 10 | 0010 0000 0010 0001 |
| 412 | 000 11 | 0010 0000 0010 0000 |
| 413 | 000 00 00 | 0001 0000 0010 0010 |
| 414 | 000 00 01 | 0001 0000 0010 0010 |
| 415 | 000 00 10 | 0001 0000 0000 0010 |
| 416 | 000 00 11 | 0001 0000 0000 0010 |

FIG. 2

- 201 START
- 210: DETERMINE A MAXIMUM LENGTH OF COMPRESSED CODES DESIRED TO BE DECODED IN A SINGLE LOOKUP
- 220: GENERATE A SOT TABLE WITH 2**M ENTRIES, WITH EACH ENTRY INDICATING WHETHER ANY PART OF THE CORRESPONDING M-BIT VALUE EQUALS A COMPRESSED CODE, AND THE SOURCE CODE CORRESPONDING TO THE COMPRESSED CODE
- 230: SELECT THE FIRST M-BITS OF A COMPRESSED BIT STREAM AS A PRESENT PORTION
- 240: RETRIEVE AN ENTRY IN SOT TABLE CORRESPONDING TO THE PRESENT PORTION
- 245: DOES THE RETRIEVED ENTRY INDICATE PRESENCE OF A COMPLETE COMPRESSED CODE?
  - NO → 250: USE MORE THAN M-BITS TO DECODE THE STREAM
  - YES ↓
- 260: DECODE THE PRESENT PORTION AS EQUALING THE SOURCE CODE IN THE ENTRY RETRIEVED IN STEP 240
- 270: SET THE LAST (M-P) BITS OF THE PRESENT PORTION AS NOT YET BEING DECODED, WHEREIN P EQUALS THE NUMBER OF BITS IN THE COMPRESSED CODE CORRESPONDING TO THE RETRIEVED ENTRY
- 280: MORE BITS FOR DECODING IN THE COMPRESSED BIT STREAM?
  - YES → 290: SELECT THE NEXT M UNDECODED BITS AS THE PRESENT PORTION
  - NO ↓
- 299 END

DECODING BIT STREAMS COMPRESSED WITH COMPRESSION TECHNIQUES EMPLOYING VARIABLE LENGTH CODES

BACKGROUND OF THE INVENTION

1. Field of the Invention

The present invention relates to decompression techniques, and more specifically to a method and apparatus for decoding bit streams compressed with compression techniques (such as Huffman Coding) employing variable length codes.

2. Related Art

Compression techniques are often used to generate smaller-size representations of bit streams. In general, a compression technique is applied on a source bit stream to generate a compressed bit stream, with the compressed bit stream having fewer bits than the source bit stream. Such compression typically reduces storage requirements and/or bandwidth requirements, as is well known in the relevant arts.

Several compression techniques use compression tables representing a mapping of a source code to a compressed code. The compressed code is typically shorter compared to the source code (at least for frequently occurring source code). In operation, a source bit stream is divided into a sequence of source codes, and each source code is mapped to the corresponding compressed code using the compression table. The resulting sequence of compressed codes represent a compressed bit stream corresponding to the source bit stream.

A compression technique may employ variable length (not a fixed number of bits) codes (either source code or compressed code). For example, Huffman coding techniques generally use variable length portions for both the source codes and compressed codes. Huffman techniques are described in further detail in a book entitled, "The Data Compression Book" by Mark Nelson and Jean-loup Gailly, M&T Books, New York, N.Y. 1995, ISBN 1-55851-434-1, which is incorporated in its entirety herewith. Thus, compressed bit streams may be generated using such compression techniques.

It is generally desirable to recover (or generate again) a source stream corresponding to a compressed stream, and the corresponding processing is commonly referred to as 'decoding'. For example, a compressed stream may be received on a network connection, and it may be necessary to decode the compressed stream to generate the corresponding source stream. The source stream usually lends to further additional processing (e.g., playing a song represented by the source stream).

Decoding operations may need to be implemented while meeting several requirements such as high throughput rate ("speed") of decoding, minimization of memory requirements, etc. Accordingly, what is needed is a method and apparatus for decoding bit streams compressed with compression techniques employing variable length codes, while meeting one or more of such requirements.

SUMMARY OF THE INVENTION

The present invention enables decompression (decoding) of a compressed bit stream generated from a source bit stream using Huffman-coding type (which use variable length compressed and source codes) compression techniques. In an embodiment, a maximum length (M) of compressed codes desired to be decoded in a single lookup of a table is first determined.

A table of $2^M$ rows is then generated, with each row indicating whether a corresponding M-bit combination (viewed from the first bit) contains a compression code (in which case the end of the compression code is present in that M-bit combination), and a corresponding source code. The length of the compression code may also be stored. In one implementation, the table (a data structure) is stored on a computer readable medium, from which a processor can retrieve and use the rows to decode a compressed bit stream.

To decode a compressed bit stream, the first M-bits of the compressed bit stream are set to a present portion. One of the $2^M$ rows with the M-bit combination equaling the present portion is selected as a matching row. If the matching row indicates that the M-bit combination contains a compressed code, at least a portion of the present portion is decoded as equaling the source code in the matching row. If the number of bits in the corresponding compression code is less than M, the corresponding fewer number of bits are deemed to be un-decoded and included in the next portion sought to be decoded.

In case a row indicates that the M-bit combination does not contain a compressed code (i.e., the end of a compressed code is not in the combination), additional bits are used for continuing decoding operation. In an embodiment, a designer may specify a value (N) and N more bits of the compressed bit stream are used for decoding. Accordingly, $2^N$ additional rows are included for all possible combinations of the N bit values. Each additional row may contain similar content as with the $2^M$ rows noted above.

The M-bit partially matching (or forming a part of) a compressed code specify which specific $2^N$ need to be searched. In an implementation, all of the $2^M$ rows and $2^N$ rows (potentially multiple sets thereof) are provided in the form of a single table and an entry in the $2^M$ rows specifies which $2^N$ rows to search in the form of an offset (from the entry). The offset is used to select the specific $2^N$ rows to use for further decoding.

Thus, the $2^N$ rows enable a decoding operation if the end of a compressed code is present within (M+N) bits. N more bits may be used if a match is not detected in the (M+N) bits. The decoding may thus continue until the entire compressed bit stream is decoded.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 2 is a flow-chart illustrating the details of a method of decompressing (decoding) a compressed bit stream in accordance with an aspect of the present invention;

DETAILED DESCRIPTION OF THE INVENTION

Figures 1, 3, 4:
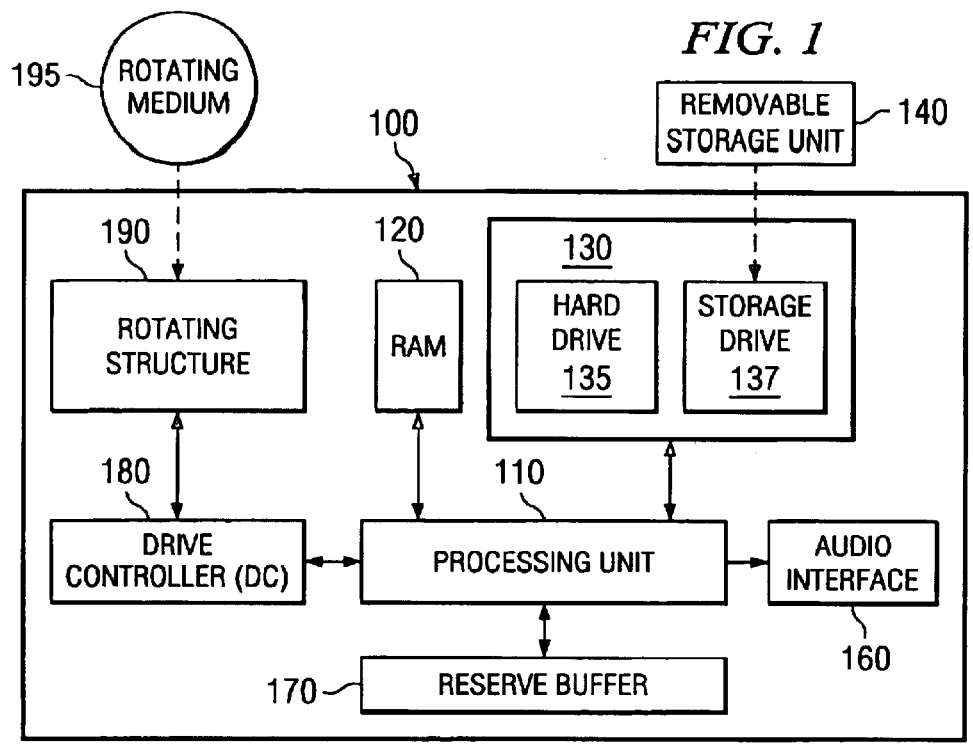
FIG. 1 is a block diagram illustrating the details of an example device in which the present invention can be implemented.
FIG. 3 is an example Huffman table used to illustrate the operation of an embodiment of the present invention.
FIG. 4 contains an SOT table generated from the Huffman table of FIG. 3 according to an aspect of the present invention.

1. Overview and Discussion of the Invention

According to an aspect of the present invention, a maximum length (M) of compressed codes desired to be decoded in a single table lookup is determined. It may be appreciated that a substantially large value of 'M' may be undesirable as implementation of corresponding tables and associated look-ups may present challenges. However, a small value of M may lead to more lookup operations.

Based on a determined value for M, a table of $2^M$ entries is generated, with each entry indicating whether a corresponding M-bit value (when examined from the first bit) equals (matches) a compressed code. In case of a match, the corresponding source code and the number of bits in the corresponding compressed code are indicated. In case there is no match, the manner in which a longer (than M-bits) bit stream can be examined for a match is specified.

Thus, in operation, M-bits ("present examining portion") of compressed data stream are used to search the above table to determine a corresponding source code. If the compressed code corresponding to the determined source code contains M-bits, the next M-bits in the compressed data stream are used to determine the next source code. If the compressed code corresponding to the determined source code contained less than M-bits, the rest of the M-bits (i.e., bits not used for decoding) are used as a part of the next M-bits for additional decoding. In case, there is no match, more bits (than the M-bits) are used to continue the decoding operation.

Due to the choice of value of M as described above, a correspondingly substantial probability exists that the source codes are determined in a single look-up of the generated table. In addition, as M is chosen to be a small number, the corresponding table (and associated look-ups) can be implemented easily.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Device

FIG. 1 is a block diagram illustrating an example device 100 in which the present invention can be implemented. Device 100 may represent an MP3-player which plays a song represented by compressed digital data stored on rotating medium 195. Device 100 is shown containing processing unit 110, random access memory (RAM) 120, secondary memory 130, audio interface 160, reserve buffer 170, drive controller 180, and rotating structure 190. The components of FIG. 1 are described below in further detail.

Audio interface 160 generates audible signals using uncompressed digital data elements received from the processing unit 110. The audible signals may represent a song in case device 100 corresponds to an MP3 player and rotating medium 195 corresponds to a compact disk storing compressed digital data representing the song.

Drive controller 180 receives commands to retrieve data, and interfaces with rotating structure 190 to retrieve the requested data. The commands may specify various parameters such as a start address, number of bytes to be retrieved, and a speed of rotating structure 190 to be used in retrieving the compressed data streams from rotating medium 195. The retrieved data is provided to processing unit 110.

Processing unit 110 may execute instructions stored in RAM 120 to provide several features of the present invention. Processing unit 110 may receive various tables used (in the embodiments described below). The tables may be received from various memory units (e.g., RAM 120 while decoding a compressed stream, or from secondary memory 130). The tables may be generated by processing unit 110 or generated externally and provided using secondary memory 130.

Processing unit 110 may contain multiple units, with each unit potentially being designed for a specific task. Alternatively, processing unit 110 may contain only a single unit. RAM 120 may receive instructions from secondary memory 130 via processing unit 110. In an embodiment, RAM 120 is integrated internal to processing unit 110. In addition, processing unit 110 and drive controller 180 may be integrated as one unit.

RAM 120 may also be used to store various tables generated in accordance with the present invention. Alternatively, more complex structures may be used to store the tables, for example, to achieve a high rate of decoding. Implementation of such alternative embodiments will be apparent to one skilled in the relevant arts by reading the disclosure provided herein, and the embodiments are contemplated to be within the scope and spirit of various aspects of the present invention.

Secondary memory 130 generally provides non-volatile data storage storing various software instructions and data, which enable device 100 to provide several features in accordance with the present invention. In the embodiment of FIG. 1, secondary memory 130 is shown containing hard drive 135 and storage drive 137 (for receiving flash memory 140 on which software instructions are provided). However, secondary memory may be implemented using various other mediums such as Floppy drive, magnetic tape drive, CD-ROM drive, DVD Drive, removable memory chip (PCMCIA Card, EPROM).

Removable storage unit 140 may be implemented using medium and storage format compatible with removable storage drive 137 such that removable storage drive 137 can read the data and instructions. Thus, removable storage unit 140 includes a computer usable (readable) storage medium having stored therein computer software and/or data. An embodiment of the present invention is implemented using software running (that is, executing) in device 100.

In this document the term "computer program product" is used to generally refer to removable storage unit 140 or any non-volatile memory providing software instructions and/or various data structures to device 100. These computer program products are means for providing software to device 100. As noted above, processing unit 110 may retrieve the software from such computer readable mediums, and execute various instructions to provide several features of the present invention. The features of the present invention are described below in further detail.

3. Method

FIG. 2 is a flowchart illustrating a method for decoding a compressed data stream in an embodiment of the present invention. The method is described with reference to components of FIG. 1 for illustration. However, the method can be implemented in other embodiments as well. The method begins in step 201, in which control immediately passes to step 210.

In step 210, a maximum length (M) of compressed codes desired to be decoded in a single lookup is determined. In general, a smaller value of M leads to smaller tables, leading to easier implementations. However, larger value of M leads to fewer look-ups (searches) of tables, and thus may lead to higher decoding throughput performance.

In one embodiment, a probability of occurrence of compressed codes of each length may be ascertained, and M be set equal to a number such that the cumulative probabilities for lengths less than or equal to the number at least equals a desired cumulative probability. The individual probabilities corresponding to each length may in turn be determined using various approaches (e.g., by examining sample compressed streams).

In step 220, processing unit 110 generates a SOT (symbol offset) table with $2^M$ entries, with each entry indicating whether the end of a compressed code is present in the M-bit value represented by the entry, and the source code corresponding to the compressed code. An example SOT table and the manner in which the table can be generated from corresponding compression tables is described in sections below. The SOT tables can be used to decompress compressed data streams as described below. In step 230, the first M-bits of a compressed bit stream (sought to be decoded) are selected as a present portion.

In step 240, processing unit 110 may retrieve an entry in SOT table corresponding to the present portion. In an embodiment, a Kth row is retrieved, with K equaling the value of the present portion. In step 245, the retrieved entry is examined to determine whether the end of a compressed code is present in the present portion. Control passes to step 260 if such a compressed code is determined to be present or else control passes to step 250.

In step 250, additional bits (i.e., in addition to the M-bits) are also used to generate the next source code (or to continue the decoding operation). An example approach for generating the source code in such a scenario is described in sections below. Control then passes to step 280.

In step 260, processing unit 110 decodes the present portion as equaling the source code in the entry retrieved in step 240. In step 270, processing unit 110 sets the last (M−P) bits of present portion as not yet being decoded, wherein P equals the number of bits in the compressed code corresponding to the retrieved entry retrieved in step 240. Accordingly, an embodiment of SOT table contains a number of bits for each entry. As described below, the M-bits for the next iteration include the un-decoded bits as well.

In step 280, input data stream is checked for the presence of more un-decoded bits. If more un-decoded bits are present, control passes to step 290. If all the bits are decoded, the method ends in step 299. In step 290, the next M-bits are selected as present portion, and the control switches back to step 240. Any bits set as un-decoded bits in step 270 are used as some of the M-bits. The steps described above may be executed until all the bits are decoded.

Thus, using the above flow-chart, data streams compressed using variable length codes can be decoded. The steps are described in further detail with reference to examples. For illustration, the compression technique is assumed to be based on Huffman Tables, well known in the relevant arts.

4. SOT Table

FIG. 3 contains an example Huffman Table 300 and FIG. 4 contains the corresponding SOT table 400 generated in an embodiment of the present invention. SOT table 400 illustrates the manner in which additional bits can be used for decoding when the M-bits of FIG. 2 are not sufficient to decode a presently processed portion. The manner in which SOT table 400 can be generated is described below in further detail.

Continuing with reference to FIG. 3, Huffman table 300 is shown containing nine rows 301–309 of data organized in the form of three columns (X, Y, and compressed code). A tuple formed from the X, Y columns in the same row represents a source code. Thus, with reference to row 303, the source code is {0,2} and the corresponding compressed code equals 000001.

Generation of SOT tables requires the value of M (the maximum number of bits desired to be decoded by a single lookup), as noted above. In addition, in an embodiment, a value of N may also be used, wherein N represents a number of additional bits to be examined if a match is not found while searching an SOT table with a previous number (M to start with) of bits. For purpose of illustration it is assumed that M=3 and N=2, and the manner in which SOT table 400 may be generated is described below.

FIG. 4 depicts SOT table 400 generated from the table of FIG. 3 in an embodiment of the present invention. SOT table 400 is shown containing sixteen rows 401–416 organized as two columns (combination and memory value). Each entry in memory value is shown containing 16 bits, referred to as b1 through b16, with b1 representing the least significant bit.

It is helpful to understand that the first eight rows 401–408 correspond to a case when M compressed bits alone are sought to be decoded. The next four rows 409–412 correspond to a case when (M+N) bits alone are sought to be decoded and the last four rows 413–416 correspond to case when (M+$2^N$) bits alone are sought to be decoded. Thus, it may be appreciated that N bits more are searched if a match is not found with a previous number (M to start with) until the next decoded value is generated. The manner in which such decoding is enabled will be clearer by understanding the content of the corresponding values in the combination and memory value columns.

The eight values in rows 401–408 of combination column respectively represent the eight values of 0 through ($2^M$−1), wherein M=3 as assumed above. Bits b9–b12 are unused in the present example. The manner in which the other bit values may be set and then used, is described below in further detail.

Bit b16 indicates whether the end of a compressed code is present in a combination (value) represented by the corresponding row. For example, b16 in row 402 is set to 0 indicating that a present portion of 001 (in compressed bit stream) contains an entire compressed code such that a corresponding source code can be generated from the present portion. Thus, with reference to FIG. 3, row 305 indicates that a compressed code of 001 equals a tuple (source code) of {1,1}.

As another representative example, b16 in row 401 is shown set to 1 indicating that a present portion of 000 (in compressed bit stream) would not match with any source codes. Thus, with reference to FIG. 3, all rows 303 and 306–309 are shown containing compressed codes starting with 000 (the value in row 401 of combination in FIG. 4). In such a case, additional bits are used for continuing the decoding as described in the below section.

Bits b15–b13 indicate the number of bits in the matching compressed code, and represents a valid value only when b16=0 (i.e., end of compressed code present). The value in bits b15–b13 is used to determine the number of un-decoded bits in each present portion. Thus, in the case when a present portion contains M-bits (3 in this example) and the compressed code contains only 1 bit (as in each of the rows 405–408), 2 bits are determined to be un-decoded and are used in a present portion of the next iteration for decoding.

In addition, when fewer than the number of bits in the present portion are contained in the matching compressed code, the same memory value (and the source code, described below) is replicated in multiple rows. Thus, all rows 405–408 contain the same memory value. As a result, the decoding throughput may be enhanced.

Bits b8–b5 and b4–b1 respectively represent the x, y tuples (thus the source code) corresponding to the matching compressed code when b16=0. For example, row 402 contains a tuple of (0001 0001) accurately representing the source code for a compressed code of 001 in FIG. 3.

On the other hand, when b16=1 (i.e., end of compressed code not present in the combination), additional bits need to be examined to determine the next source code. The manner in which the additional bits can be examined is described below in further detail.

5. Examination of Additional Bits

In an embodiment of the present invention, a designer further specifies a number of additional bits (N) to be examined if a number of bits previously examined does not contain an entire compressed code. For purpose of illustration, N is assumed to equal 2.

Continuing with reference to FIG. 4, when b16 equals 1 (indicating that additional bits are to be examined), bits b8–b1 specify an offset from a present entry. The rows at the offset contain the information for additional decoding. For illustration, row 401 (with b16=1) indicates an offset of 8 in bits b8–b1. Accordingly, 4 rows (corresponding to N=2) starting from row 409 contain the necessary information for further decoding as described below.

Rows 409–412 contain the all the four possible combinations of two bits (corresponding to N=2) in conjunction with 000. Thus, rows 409 through 412 respectively correspond to a lookup of present values 00000,00001,00010, 00011. The memory value of the four rows is set as described above.

When b16=1 in these four rows 409–412, two more bits (i.e., 3+2+2=7) are examined. Thus, bit b16 in row 409 is shown equal to 1, and an offset of 4 is contained in bits b4–b1. Thus, rows 413–416 contain information for continuing the decoding operations. It may be appreciated that the content of FIG. 4 thus generated is consistent with Huffman Table of FIG. 3. The manner in which SOT table 400 can be used for decoding a compressed bit stream is described below with an example.

6. Decoding Example

For purpose of illustration, it is assumed that a compressed bit stream of 000 000 100 0011 (spaces left in between merely for readability) is generated from a source bit stream using Huffman Table of FIG. 3. The manner in which the compressed bit stream can be decoded using the flow-chart of FIG. 2 and SOT table 400 of FIG. 4 is described below.

As described above, SOT table 400 is generated assuming M=3 and N=2. As stated in step 230, the present portion is set to the first 3 (M) bits of the compressed bit stream to start the decoding operation. Thus, present portion=000 for the first iteration.

Row 401 corresponds to the present portion as the 'combination' entry equals the present portion. Bit b16 indicates that the end of compressed code is not present in the present portion, and bits b8–b1 indicate an offset of 8. Thus, examination is continued from row 409, corresponding to an offset of 8.

Two more bits are added to the present portion corresponding to a value of 2 for N. Thus, present portion now equals 00000, and is compared with combination value in the four rows 409–412. Row 409 is retrieved as the entry in the combination column equals the present portion. Bit b16 again indicates that the end of compressed code is not present in the present portion. As an offset value of 4 is indicated, examination continues from row 413.

Two more bits are added to the present portion, causing the present portion to equal 000 000 1. Row 414 is selected, which indicates that the end of compressed code is present and also that the number of matching bits equals 1 (of the two bits added). Thus, the last bit (1) is considered to be an un-decoded bit, which implies only 000 000 forms the compressed code. The corresponding source code is contained in bits b8–b1, and equals {0010, 0010} consistent with row 309 in the table of FIG. 3.

As more un-decoded bits are present, control passes to step 290. The present portion is set to the next M-bits, which equals 100. Row 405 is selected, which indicates that the end of code is present and that the compressed code contains only one bit. Thus, bit 1 is determined to be decoded to {0000, 0000}, consistent with row 301. In addition, the last two bits 00 are considered un-decoded and used in further decoding as described below.

In the next iteration, the present portion is set to 000, which causes additional two bits to be considered. Thus, present portion is set to 00001, which corresponds to a source code of {1,2} according to row 410 (also consistent with row 306). All the bits are considered decoded as bits b1 5–b13 equal a value of 2. In the last iteration, a present portion of 011 is decoded to equal a source code of {0001, 0000} as specified in row 404 (consistent with row 304). Thus, the compressed bit stream of 000 000 100 0011 is decoded into tuple stream of {2,2}, {0,0}, {1,2}, {1,0}.

While the decompression is described above with reference to example data structures for illustration, various modifications can be made without departing from the scope and spirit of the present invention. For example, instead of using offsets and using a single table for searches as shown in FIG. 4, rows 409–412 and 413–416 may respectively be organized as separate tables, and memory value maybe set to indicate the appropriate identifiers of such tables. In addition, while the approaches are described as being implemented substantially in the form of software, specialized integrated circuits may be implemented to realize various features of the present invention.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of decoding a compressed bit stream, wherein a source bit stream is compressed according to a compression technique to generate said compressed bit stream, said compression technique specifying a plurality of source codes and a corresponding plurality of compression codes, wherein all of said plurality of source codes are not of same length and all of said plurality of compressed codes are not of same length, said method comprising:

receiving said compressed bit stream;

setting a present portion to equal M-bits of said compressed bit stream, wherein M represents an integer;

selecting a first matching row contained in $2^M$ rows, each of said $2^M$ rows indicating whether a corresponding one of a plurality of M-bit combinations contains one of said plurality of compression codes and a corresponding one of said plurality of source codes, wherein said first matching row is associated with a M-bit combination equaling said present portion; and decoding at least a part of said present portion to equal a present source code if said first matching row indicates that a corresponding M-bit combination contains one of said plurality of compression codes, wherein said present source code is generated to equal a source code in said first matching row if said first matching row indicates that a corresponding M-bit combination contains one of said plurality of compression codes, wherein said present source code is comprised in said source bit stream;

wherein a compressed code corresponding to said source code in said first matching row is of P-bits length, said method further comprising:

setting (M−P) bits of said present portion as being un-decoded bits; and using said un-decoded bits as a part of a next portion, wherein said next portion is decoded to generate a next source code, wherein said next source code is comprised in said source bit stream;

wherein said first matching row indicates that a corresponding one of said plurality of M-bit combination does not contain any one of said plurality of compression codes, said method further comprising:

selecting a second matching row contained in $2^N$ rows, wherein N additional bits in said compressed bit stream are used to determine said present source code, each of said $2^N$ rows also indicating whether a corresponding one of a plurality of N-bit combination contains one of said plurality of compression codes and a corresponding one of said plurality of source codes, wherein said second matching row is associated with a N-bit combination equaling said N-additional bits.

2. The method of claim 1, wherein M is set to a maximum length of said compressed codes desired to be decoded in a single lookup of a table containing said $2^M$ rows.

3. The method of claim 2, further comprising:

ascertaining a probability associated with each length of said plurality of compressed codes, wherein said probability is proportionate to a frequency of occurrence of compressed codes of each length; and determining said M to equal a number such that the cumulative probabilities for lengths less than or equal to the number at least equals a desired cumulative probability.

4. The method of claim 2, wherein M is set equal to a length of one or more of said plurality of compressed codes, wherein said one or more of said plurality of codes have more probability of occurrence than any other of codes of a same length.

5. The method of claim 1, wherein said P is included in each of said $2^M$ rows if the corresponding row indicates that a corresponding one of said plurality of M-bit combination contains one of said plurality of compression codes.

6. The method of claim 1, wherein said compression technique is based on a Huffman Table.

7. The method of claim 6, wherein said compressed bit stream represents audio data from which audible signals are generated.

8. A computer readable medium carrying one or more sequences of instructions for causing a device to decode a compressed bit stream, wherein a source bit stream is compressed according to a compression technique to generate said compressed bit stream, said compression technique specifying a plurality of source codes and a corresponding plurality of compression codes, wherein all of said plurality of source codes are not of same length and all of said plurality of compressed codes are not of same length, wherein execution of said one or more sequences of instructions by one or more processors contained in said device causes said one or more processors to perform the actions of:

receiving said compressed bit stream;

setting a present portion to equal M-bits of said compressed bit stream, wherein M represents an integer;

selecting a first matching row contained in $2^M$ rows, each of said $2^M$ rows indicating whether a corresponding one of a plurality of M-bit combination contains one of said plurality of compression codes and a corresponding one of said plurality of source codes, wherein said first matching row is associated with a M-bit combination equaling said present portion; and decoding at least a part of said present portion to equal a present source code if said first matching row indicates that a corresponding M-bit combination contains one of said plurality of compression codes, wherein said present source code is generated to equal a source code in said first matching row if said first matching row indicates that a corresponding M-bit combination contains one of said plurality of compression codes, wherein said present source code is comprised in said source bit stream;

wherein a compressed code corresponding to said source code in said first matching row is of P-bits length, further comprising:

setting (M−P) bits of said present portion as being un-decoded bits; and using said un-decoded bits as a part of a next portion, wherein said next portion is decoded to generate a next source code, wherein said next source code is comprised in said source bit stream;

wherein said first matching row indicates that a corresponding one of said plurality of M-bit combination does not contain any one of said plurality of compression codes, further comprising:

selecting a second matching row contained in $2^N$ rows, wherein N additional bits in said compressed bit stream are used to determine said present source code, each of said $2^N$ rows also indicating whether a corresponding one of a plurality of N-bit combination contains one of said plurality of compression codes and a corresponding one of said plurality of source codes, wherein said second matching row is associated with a N-bit combination equaling said N-additional bits.

9. The computer readable medium of claim 8, wherein M is set to a maximum length of said compressed codes desired to be decoded in a single lookup of a table containing said $2^M$ rows.

10. The computer readable medium of claim 9, further comprising:

ascertaining a probability associated with each length of said plurality of compressed codes, wherein said probability is proportionate to a frequency of occurrence of compressed codes of each length; and determining said M to equal a number such that the cumulative probabilities for lengths less than or equal to the number at least equals a desired cumulative probability.

11. The computer readable medium of claim 9, wherein M is set equal to a length of one or more of said plurality of compressed codes, wherein said one or more of said plurality of codes have more probability of occurrence than any other of codes of a same length.

12. The computer readable medium of claim 8, wherein said P is included in each of said $2^M$ rows if the corresponding row indicates that a corresponding one of said plurality of M-bit combination contains one of said plurality of compression codes.

13. The computer readable medium of claim 8, wherein said compression technique is based on a Huffman Table.

14. An apparatus for decoding a compressed bit stream, wherein a source bit stream is compressed according to a compression technique to generate said compressed bit stream, said compression technique specifying a plurality of source codes and a corresponding plurality of compression codes, wherein all of said plurality of source codes are not of same length and all of said plurality of compressed codes are not of same length, said apparatus comprising:

means for receiving said compressed bit stream;

means for setting a present portion to equal M-bits of said compressed bit stream, wherein M represents an integer;

means for selecting a first matching row contained in $2^M$ rows, each of said $2^M$ rows indicating whether a corresponding one of a plurality of M-bit combination contains one of said plurality of compression codes and a corresponding one of said plurality of source codes, wherein said first matching row is associated with a M-bit combination equaling said present portion; and means for decoding at least a part of said present portion to equal a present source code if said first matching row indicates that a corresponding M-bit combination contains one of said plurality of compression codes, wherein said present source code is generated to equal a source code in said first matching row if said first matching row indicates that a corresponding M-bit combination contains one of said plurality of compression codes, wherein said present source code is comprised in said source bit stream;

wherein a compressed code corresponding to said source code in said first matching row is of P-bits length, said apparatus further comprising:

means for setting (M−P) bits of said present portion as being un-decoded bits; and means for using said un-decoded bits as a part of a next portion, wherein said next portion is decoded to generate a next source code, wherein said next source code is comprised in said source bit stream;

wherein said first matching row indicates that a corresponding one of said plurality of M-bit combination does not contain any one of said plurality of compression codes, said apparatus further comprising:

means for selecting a second matching row contained in $2^N$ rows, wherein N additional bits in said compressed bit stream are used to determine said present source code, each of said $2^N$ rows also indicating whether a corresponding one of a plurality of N-bit combination contains one of said plurality of compression codes and a corresponding one of said plurality of source codes, wherein said second matching row is associated with a N-bit combination equaling said N-additional bits.

15. The apparatus of claim 14, wherein M is set to a maximum length of said compressed codes desired to be decoded in a single lookup of a table containing said $2^M$ rows.

16. The apparatus of claim 14, wherein said P is included in each of said $2^M$ rows if the corresponding row indicates that a corresponding one of said plurality of M-bit combination contains one of said plurality of compression codes.

* * * * *